United States Patent [19]
Cornwall et al.

[11] Patent Number: 5,180,441
[45] Date of Patent: Jan. 19, 1993

[54] SOLAR CONCENTRATOR ARRAY

[75] Inventors: Mickey Cornwall; David M. Peterson; Theodore G. Stern, all of San Diego, Calif.

[73] Assignee: General Dynamics Corporation/Space Systems Division, San Diego, Calif.

[21] Appl. No.: 715,268

[22] Filed: Jun. 14, 1991

[51] Int. Cl.$^5$ .......................................... H01L 31/052
[52] U.S. Cl. ..................................... 136/246; 136/292
[58] Field of Search ................................ 136/246, 292

[56] References Cited
U.S. PATENT DOCUMENTS
4,153,474  5/1979  Rex ...................................... 136/246

Primary Examiner—Aaron Weisstuch
Attorney, Agent, or Firm—John R. Duncan; Frank D. Gilliam

[57] ABSTRACT

A solar concentrator panel having an array of off axis cylindrical parabolic mirrors with an optical design of relatively short focal length solar cells arranged in line that converts sunlight to electricity. The back surface of the mirrors are used as the solar cell mount and the heat sink for the adjacent mirror. By appropriate positioning of the adjacent mirror so that the focal line of the parabola falls within the boundary or rim of the mirror reflected solar light can be directed to the solar cell mounted on the back of the adjacent mirror and converted to electricity.

5 Claims, 1 Drawing Sheet

SOLAR CONCENTRATOR ARRAY

BACKGROUND OF THE INVENTION

The present invention relates generally to an improvement in photovoltaic concentrator arrangements for space applications and more particularly, but not by way of limitation, to a space deployable system to convert solar energy into electrical energy by directing concentrated solar energy onto photovoltaic solar cells which convert this solar energy into electrical energy and more particularly, to an array of concentrator elements wherein the solar mirror reflectors use the back surface of adjacent mirror reflector to support their associated solar cells and act as an integral heat sink for said cells.

A number of photovoltaic arrangements for converting sunlight into electricity have been proposed for space applications. For example, the proposed space station generally discloses large planar photovoltaic cell arrays that extend from each side of a support structure in an opposed arrangement. The present proposed planar photovoltaic arrangements clearly could be improved by an arrangement which would be more compact and have higher energy output per square foot of occupied surface. The present invention is believed to overcome the shortcomings of the previously known planar photovoltaic cell arrangement for space applications while providing a number of advantages over those previously known planar photovoltaic cell arrangements.

SUMMARY OF THE INVENTION

Briefly stated, the present invention contemplates a plurality of spaced apart cylindrical off axis parabolic mirror elements that are positioned adjacent to each other. The back of each mirror element is positioned so that the focal line of the next adjacent mirror is on the back surface of that mirror where the photovoltaic solar cell assembly positioned thereon receives that focused light and the mirror structure is designed to provide a heat sink effect for each mirror and the solar cell assembly.

The combination reflector, heat sink and solar cell mount, which resembles a Venetian blind slat, can easily be fabricated to require tolerances through a number of means, including extrusion of a metal part, roll-forming, slip rolling, machining, and electroforming.

An additional advantage of the design is that the mirror backside upon which is mounted the solar cell assembly also can be used as a waste-heat emitting radiator, further combining functions and eliminating the need for a separate radiator component.

A further advantage of the design is that the mirror facing and backing the solar cell assembly can prevent or diminish the effects of electromagnetic, particulate (electrons, protons, etc.), and off-axis laser irradiation from accessing the solar cell through shielding and baffling of the solar cell by the mirror bulk material.

An object of this invention is to provide a photovoltaic solar electric producing array that occupies a smaller given area of space than existing photovoltaic arrays for the energy produced thereby.

Another object of this invention is to produce a photovoltaic solar electric producing array that can prevent or diminish the effects of electromagnetic, particulate, and off axis-laser irradiations from accessing the solar cell through shielding and baffling of the solar cell.

Further objects, features and advantages of the invention will be evident from the detailed description, when read in conjunction with the accompanying drawings which illustrate the invention.

DETAILED DESCRIPTION OF THE PREFERRED EMBODIMENT OF THE INVENTION

Figure 1:
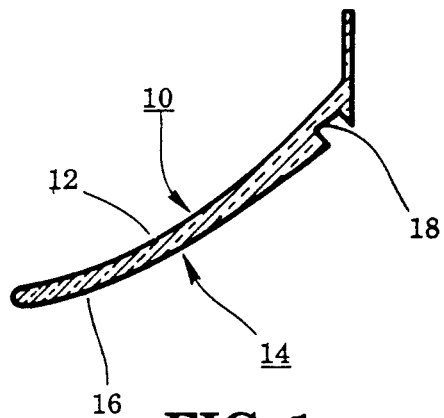
FIG. 1 depicts a cross-sectional showing of a single reflector of the invention and FIG. 2 depicts a cross-sectional showing of an array of concentrator elements.

FIG. 1 depicts a single reflector 10 of the present invention. The reflector has an off axis parabolic contoured reflective surface 12 and a bottom surface (backside) 14 that may also have a reflective surface 16 thereon, hereinafter explained in more detail. A mounting slot 18 is provided on the bottom surface (backside) 14 for receiving a solar cell assembly therein. The solar cell assembly fits within slot 18 with its outer surface flush with the bottom surface of the reflector forming a smooth continuation of the bottom surface. The mirror has a generally thick bulk to act as a heat sink hereinafter discussed.

Figure 2:
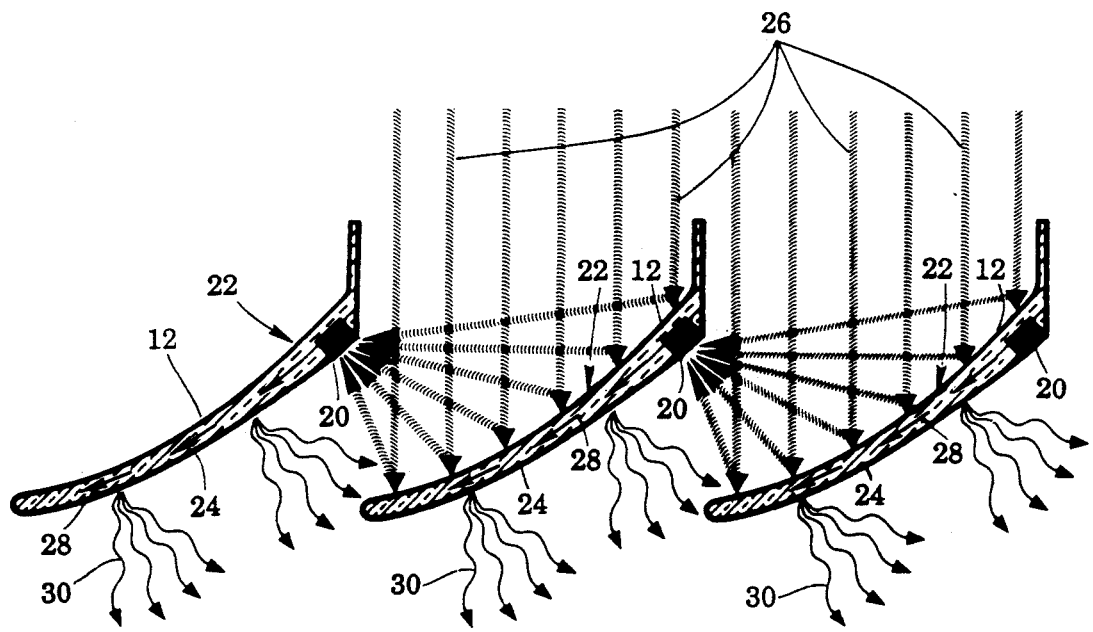

FIG. 2 depicts a cross-sectional showing view of an array of concentrator elements. Only three concentrator elements are shown for ease of explanation. It should be understood that any convenient number of additional concentrator elements may be added to the array shown, limited only by the required electricity produced therefrom and the area available for their placement. FIG. 2 shows the off-axis parabolic front surface 12, the solar cell assembly 20, the variation of the thickness through the reflector as indicated along the reflector between arrows 22 and 24 which allows for appropriate heat sinking, although a constant thickness reflector could also be utilized.

Incoming light, shown by broken arrows 26 reflects off of the front surface 12 of the reflector panel 10 and is concentrated onto the surface of the photovoltaic solar cell 20. The arrows 28 show the flow of heat from the solar cell 20 through the body of the reflector panel 10. Wavy arrows 30 show the emission of waste heat by radiation to space off of the reflector panel.

The contour of the surface 12 of the reflector panel 10 follows the equation $Y = 0.115 X \wedge 2$, where Y and X are given in centimeters and X ranges from 0.5 to 5.0. With this curvature, the focus of the parabola is at the coordinate point (0, 2.174) so that the ratio of focal distance to aperture diameter (F/d) of this design is approximately 0.5 centimeters. Other curvatures and F/ds could be used, although the above curvature is optimized for the purpose intended. The scaling of the parabola is also to provide sufficiently short path lengths for thermal conduction to the needed emissive area.

Increasing the F/d moves the solar cell assembly position up the panel bottom surface (backside) and reducing the F/d positions the solar cell assembly down the solar panel bottom surface (backside). The variations of the F/d are used to ideally position the solar cell assemble on the panel bottom surface 14 for the purpose intended.

While the drawing FIG. 2 shows the waste heat being rejected off the bottom surface 14 of the panel 10, a separate radiator plate attached to mirror 16 could also be used. The advantage of using a separate radiator is that it would allow the mirror back surface (backside) 14 to be reflective, rather than emissive, in the infrared spectral region. This feature has benefits for laser survivability of this design since absorption of infrared lasers would not occur near the solar panel assembly.

As aforementioned, while the drawing FIG. 2 shows an array of three concentrator elements, any number of panels can be placed in a row of panel-cells. The number of rows of panel-cells can be built up into two-dimensional arrays of elements to provide higher power levels.

The various components of the photovoltaic panels of the invention are chosen to be suitable for the purposes intended.

While specific embodiments of the photovoltaic panels have been shown and fully explained above for the purpose of illustration it should be understood that many alterations, modifications and substitutions may be made to the instant invention disclosure without departing from the spirit and scope of the invention as defined by the appended claims.

What is claimed is:

1. A space efficient solar energy to electrical energy panel array comprising:
   two or more adjacent panels having a parabolic reflective surface on one side thereof for receiving solar light energy and a backside opposite to said parabolic reflective surface, said backside including a slot;
   a photovoltaic solar energy to electrical energy power cell being positioned in said slot on said backside of each of said two or more adjacent panels so that the outer distal surface of said photovoltaic power cell is flush with said backside surface forming a smooth continuation thereof, whereby solar energy reflected by said reflective surface is directed to said power cell on the backside of an adjacent panel.

2. The space efficient solar energy to electrical energy panel array of claim 1 wherein said backside of each of said panels includes a reflective surface for reflecting infrared energy from being absorbed by said panel.

3. The space efficient solar energy to electrical energy panel array of claim 1 wherein each of said panels has sufficient thickness between its reflective and back surface to conduct heat therethrough to act as a heat sink to waste heat emission.

4. The space efficient solar energy to electrical energy panel array of claim 1 wherein the contour of said reflective surface follows the following equation $$Y = 0.115 X^2$$

where X and Y are given in centimeters and X ranges from 0.5 to 5.0 resulting in a focal distance of 0.5 centimeters.

5. The space efficient solar energy to electrical energy panel array of claim 1 wherein the panels are positioned so that substantially all of the reflective surface receives solar energy and that solar energy is all substantially directed to said photovoltaic solar cell.

* * * * *